United States Patent [19]

Vegh et al.

[11] Patent Number: 4,892,616

[45] Date of Patent: Jan. 9, 1990

[54] PROCESS FOR STRIPPING COLOR FILTER ARRAYS FROM SUBSTRATES

[75] Inventors: Bertalan J. Vegh, Fairport; Laurel J. Pace, Rochester, both of N.Y.

[73] Assignee: Eastman Kodak Company, Rochester, N.Y.

[21] Appl. No.: 263,940

[22] Filed: Oct. 28, 1988

[51] Int. Cl.$^4$ .................. B44C 1/22; C03C 15/00; C03C 25/06; B29B 37/00

[52] U.S. Cl. ......................................... 156/655; 134/3; 156/668; 252/79.2; 430/329

[58] Field of Search ............. 156/655, 659.1, 662, 156/668; 134/3, 38; 430/7, 329, 513; 252/79.2

[56] References Cited

U.S. PATENT DOCUMENTS

| | | | |
|---|---|---|---|
| 4,315,978 | 2/1982 | Hartman | 430/4 |
| 4,355,087 | 10/1982 | Martin | 430/7 |
| 4,764,670 | 8/1988 | Pace et al. | 250/226 |

OTHER PUBLICATIONS

*The Chemist's Companion*, Arnold J. Gordon and Richard A. Ford, Editors, John Wiley and Sons, New York, 1972, pp. 428–429.

Lelah et al, "The Wettability of Soda–Lime Glass: The Effect of Cleaning Procedures", *Ceramic Bulletin*, vol. 58, No. 11 (1979), pp. 1121–1124.

*Primary Examiner*—William A. Powell
*Attorney, Agent, or Firm*—William J. Davis

[57] ABSTRACT

A process for stripping a color filter array coating from a substrate of a solid-state color image sensing device to recover the substrate so that it subsequently can be used to produce another solid-state color image sensing device, such process comprising contacting the coating with a stripping solution comprising chromic acid and sulfuric acid for a time effective to remove the coating from the substrate. The process efficiently removes all of the coating, even when the coating has been baked and hardened by various processing steps, and does not adversely affect the electrical properties of the device, the exposed bond pads, or the backside of the wafer.

6 Claims, No Drawings

PROCESS FOR STRIPPING COLOR FILTER ARRAYS FROM SUBSTRATES

CROSS REFERENCE TO RELATED APPLICATION

Reference is hereby made to commonly-assigned copending U.S. patent application Ser. No. 263,939 entitled CLEANING OF SUBSTRATES FOR COLOR FILTER ARRAY FABRICATION filed in the name of B. J. Vegh concurrently herewith.

FIELD OF INVENTION

This invention relates to the field of solid-state color imagers and, more particularly, to a process for stripping color filter arrays from substrates employed in such imagers.

BACKGROUND OF THE INVENTION

Solid-state color imaging devices and methods for making them are well known in the art. For example, Hartman, U.S. Pat. No. 4,315,978; Martin, U.S. Pat. No. 4,335,087 and Pace and Blood, U.S. Pat. No. 4,764,670 disclose such devices having high resolution and methods for making them wherein color filter arrays formed from dyeable photopatternable coatings are fabricated on light-sensing semiconductor substrates. A color filter array is the lithographically patterned set of colors which can be placed on top of an electronic imager enabling it to sense colors. Color filter array coatings typically comprise dyeable photopatternable coatings, intermediate barrier layers, and non-dyeable photopatternable coatings, for example, those used for planarizing layers and protective overlayers.

A particularly useful process for preparing a solid-state color image sensing device having color filter arrays includes the steps of applying a coating of a dyeable photopatternable material to the surface of a silicon-containing wafer substrate having an array of charge-handling semiconductive photosensors and bonding pad areas, imagewise exposing and developing the coating so as to form a pattern corresponding to a filter element, and dyeing the exposed and developed pattern by contacting the pattern with a solution comprising a dye. Subsequently, the steps of coating, imagewise exposing, developing, and dyeing the remaining filter element are repeated, differing only in the pattern and/or its location and the dye employed, to form sets of color filters, for example, sets containing red, green and blue or cyan, magenta and yellow filter elements or combinations thereof. To achieve high resolution, the color filter elements must be in microregistration with the underlying array of photosensors. This means that the filter elements and the photosensor array must be precisely aligned on a micron scale.

Each of the numerous steps involved in the fabrication process affects the quality, for example, the resolution and/or chrominance discrimination, of the ultimate solid-state color image sensing device. In view of the exacting criticalities involved, the yield of acceptable high quality, high resolution solid-state color image sensing devices tends to be less than 100% through the fabrication process. In view of the costs associated with the substrates upon which color filter arrays are fabricated in making solid-state color image sensing devices, it would be highly desirable to be able to recover substrates from partly or fully fabricated devices so that the substrate could subsequently be used to produce another solid-state color image sensing device.

Thus, the problem facing the art has been to provide a process for stripping color filter array coatings from a substrate of a solid-state color image sensing device so that the substrate can be used to produce another solid-state color image sensing device, which effectively removes all of the coating in a reasonable amount of time, even when the coating has been baked and hardened by various processing steps, and which does not adversely affect the electrical properties of the device, the exposed bond pads or the backside of the water.

A wide variety of stripping approaches have been investigated. However, none of these has been fully satisfactory for one or more of the above-noted reasons. For example, color filter array coatings have been contacted with boiling nitric acid and hot triethanolamine. Such chemical stripping treatments do not efficiently remove all of the photopatternable coating from the substrate, even after extended periods of contact time. Coatings have also been subjected to etching by oxygen plasma, however, etching processes tend to be very time-consuming and, in many cases, leave a residue remaining on the substrate surface.

SUMMARY OF THE INVENTION

We have solved this problem by providing a process for efficiently stripping color filter arrays from device wafers.

More specifically, in accordance with the present invention, there is provided a process for stripping a color filter array coating from a substrate of a solid-state color image sensing device to recover the substrate which subsequently can be used to produce another solid-state color image sensing device. The process comprises contacting the coating with a stripping solution including chromic acid and sulfuric acid for a time effective to remove the coating from the substrate.

In a preferred embodiment of the invention, the process comprises the steps of (1) contacting the color filter array coating with the above-described stripping solution, (2) rinsing the substrate with water, and (3) repeating steps (1) and (2) at least once.

The process of this invention removes all of the coating in a reasonable amount of time, even when the coating has been baked and hardened by various processing steps, and does not adversely affect the electrical properties of the device, the exposed bond pads, or the backside of the wafer.

DESCRIPTION OF THE PREFERRED EMBODIMENTS

The process of this invention is described primarily in connection with a color solid-state image sensing device having color filter array coatings fabricated on a silicon-containing device wafer substrate. In addition, the process is useful when color filters formed from dyeable photopatternable coatings are fabricated on other substrates, for example, gallium arsenide, and in the manufacture of color wheels and liquid crystal displays.

In accordance with this invention, a color filter array coating is removed from a device substrate by contacting the coating with a stripping solution including chromic acid and sulfuric acid. Subsequently, the substrate can be used to produce another color image sensing device.

As used herein, the term "color filter array coating" is intended to include any or all of the following:

(a) a dyeable photopatternable coating that is either undyed or dyed;
(b) intermediate barrier layers; and
(c) non-dyeable photopatternable coatings, for example, those used for planarizing layers and protective overlayers.

The stripping solution preferably contains chromic acid in an amount of 1–300, more preferably 10–150 grams per liter of solution. In addition, the solution preferably contains 10–99, more preferably 50–98 percent by weight of sulfuric acid. As is conventional, the sulfuric acid can be provided in the form of a concentrated aqueous solution.

It is believed that chromic acid and sulfuric acid are the essential ingredients of the stripping solution and provide the aforedescribed advantageous results. For reasons Applicants do not fully understand, the above-described acid mixture is particularly efficient in oxidizing color filter array coatings. While not essential to achieve the advantageous results, the stripping solution can optionally contain additional ingredients, for example, surfactants, wetting agents, stabilizers, etc., so long as they do not adversely affect the resulting stripped solid-state image sensing device substrate.

The chromic acid can be added to the solution, for example, in the form of a chromate compound such as sodium chromate, sodium dichromate, potassium chromate, potassium dichromate and the like. Acceptable results have been obtained with solutions mixed up to 4 weeks prior to use. The above-noted chromate compounds preferably are added to the aqueous concentrated sulfuric acid solution in a saturating amount. In the practice of this invention, the substrate is contacted with the stripping solution, for example, by immersion in the stripping solution, to remove the photopatternable material from the substrate.

A commercially available ready-made chromte concentrate (25 ml), available under the trade name "Chromerge" from Manostat Corporation, can conveniently be added to a standard (9 lb.) bottle of concentrated $H_2SO_4$ to make the stripping solution mixture.

In accordance with this invention, the color filter array coating is contacted with the above-described stripping solution for a time effective to remove the coating from the substrate. The coating can be contacted with the stripping solution and effectively removed at any time of the fabrication process, for example, before or after the coating is photopatterned, developed, dyed, or hardened. We have found that dyeable photopatternable coatings can be completely removed from the substrate in relatively brief amounts of time, that is in less than about 15 minutes. In some instances, the coating can be removed in less than about one minute. The amount of time required to effect complete removal of the coating depends, of course, on the particular photopatternable material to be removed, the coating thickness, the processing steps to which it has been subjected, etc., and can readily to be determined by one of ordinary skill in the art.

Prior to this invention, it was known to use a mixture of chromic acid and sulfuric acid as a glassware cleaning solution (see, for example, *The Chemist's Companion*, Arnold J. Gordon and Richard A. Ford, Editors, John Wiley and Sons, New York, 1972, pages 428–429). Heretofore, it was also known that a 100:5:8 solution of $H_2SO_4:K_2CrO_4:H_2O$ is effective in decreasing the contact angle (improving wettability) of soda-lime glass, as is indicated by M. D. Lelah and A. Marmur in "The Wettability of Soda-Lime Glass: The Effect of Cleaning Procedures", *Ceramic Bulletin*, Vol. 58, No. 11 (1979) pages 1121–1124. However, the prior art does not teach or suggest that such a solution can effectively remove a dyeable photopatternable coating from a substrate even when the coating has been baked and hardened by various processing steps.

The process of this invention is useful with any dyeable aqueous-based photopatternable coating useful in the preparation of color filter elements on substrates. The process of this invention has been tested with a wide variety of aqueous-based systems. All of the aqueous-based systems have been effectively stripped by the process of this invention. However, the stripping solution is not effective on all layers coated from organic solvents. For example, the process is useful with any of the aqueous-based photopatternable coatings and substrates disclosed in U.S. Pat. Nos. 4,764,670, 4,355,087 and 4,315,978, the disclosures of which are hereby incorporated by reference in their entirety. The process is also useful with the photopatternable coatings described in commonly owned copending U.S. patent applications Ser. No. 87,486 filed Aug. 20, 1987; Ser. No. 195,917 filed May 19, 1988; and Ser. No. 211,810 filed June 24, 1988; the disclosures of which are hereby incorporated by reference in their entirety.

For example, the dyeable photopatternable coating can be formed from materials such as hydrophilic colloids in admixture with a radiation-responsive hardening agent, e.g., dichromated gelatin; diazo resins mixed with a mordant, e.g., those described in U.S. Pat. No. 4,220,700; poly(vinyl alcohols) in admixture with a dichromate and a polymeric mordant; anionic or cationic mordants; or photocrosslinkable mordants. Typically, the thickness of the dried photopatternable coating is at least about 0.5 $\mu$m and can be greater than 2 $\mu$m.

In addition, the above-described stripping process is advantageously employed when barrier layers are used in the process for preparing the solid-state color imager. The stripping process is useful with barrier layers (aqueous and non-aqueous) formed from materials known in the art including, for example, nitrocellulose, poly(glycidyl methacrylate), poly(methyl methacrylate), poly(isopropenyl ketone), and polyester ionomers, as described in U.S. Pat. No. 4,315,978. The process is useful with planarizing layers, for example, organic planarizing layers, and with some protective overcoats, for example, those formed from poly(vinyl alcohols).

The process of this invention effectively removes color filter array coatings from any substrate effective for providing a solid-state color image sensing device. Examples of suitable substrates including silicon-containing substrates such as monocrystalline silicon, polycrystalline silicon, silicon dioxide, borosilicate, silicon nitride soda-lime, fused silica, spin-on-glass and the like. Other useful substrates include gallium arsenide.

A substrate which is particularly useful in a solid-state color image sensing device comprises an array of charge-handling semiconductive photosensors and bonding pad areas on a silicon wafer. After the color filter array is formed on the surface of the substrate, electrical contacts are made to the same surface of the substrate through such bonding pad areas. As is well known in the art, the surface of the wafer can also contain other areas such as dicing lines along which the wafer can be cut, areas referred to as guard bands, and so forth. Examples of charge-handling semiconductive photosensors include charge-coupled devices (also known as charge-transfer imagers and the like), charge-injection devices, bucket brigade devices, diode arrays, combinations of these and the like, useful silicon-containing substrates having photosensitive arrays are described, for example, in U.S. Pat. No. 3,801,884, and are commercially available. In typical devices of this type, the surface often is coated with a protective layer of $SiO_2$.

In a particularly preferred technique for practicing this invention, the stripping process comprises the steps of (1) contacting the color filter array coating with a stripping solution comprising chromic acid and sulfuric acid, (2) rinsing the substrate with water, and (3) repeating steps (1) and (2) at least once, and, more preferably, at least twice. Excellent results have been obtained by this technique.

As noted, the present invention is useful in readily removing photopatternable coatings in both partly and fully fabricated solid-state color image sensing devices. This is so even when the coating or coatings have been hardened by various bakes and processing steps. For example, during processing, the dyed coating may be hardened by baking at a temperature up to about 200° C. for a time up to about one hour. Advantageously, the process has been found to be effective in removing dyed photo patternable coatings which have been dyed with a variety of dyes known to be useful in preparing solid-state color image sensing devices.

Applicants have found that the above-described stripping process is superior to a wide variety of stripping processes evaluated. As indicated above, a variety of chemical stripping processes could not effectively remove the photopatternable coating from the substrate, even after extended periods of contact time. On the other hand, etching processes, such as plasma etching, which can remove the entire photopatternable coating, are extremely costly and disadvantageously time consuming, in view of the thickness and composition of the photopatternable coatings to be removed. Moreover, plasma discharge can cause electrical problems in some devices.

The following example further illustrates the invention.

EXAMPLE

A 3-color array was fabricated on a wafer of CCD semiconductor image sensors as described in Example 3 of U.S. Pat. No. 4,764,670. The wafer was soaked for 10 seconds in a bath made by adding 35 ml of a saturated solution of potassium dichromate to 1 liter of concentrated sulfuric acid. The wafer was the rinsed for 15 seconds in deionized water. At this point, much of the 3-color array had already been removed as a result of the treatment. The remainder of the photopatterned material was removed after a second soak/rinse cycle. This wafer was thoroughly rinsed to removed any excess acid, and then a new 3-color array was fabricated on the wafer. There were no adhesion problems between any of the dyed layers and the substrate surface. Moreover, there was no degradation in the performance of the CCD semiconductor image sensors on the wafer.

COMPARATIVE EXAMPLE

A 3-color array like that described in Example 1 above was fabricated on a second wafer. The wafer was soaked for 10 seconds in fuming nitric acid and rinsed in deionized water for 15 seconds. The soak/rinse cycle was then repeated a second time. As a result of the treatment, the photopatterned layers had clearly swelled and reticulated on the surface of the substrate, and much of the dye had been removed. However, the layers still adhered to the surface of the substrate. Soaking for an additional 15 minutes in the fuming nitric acid caused increased reticulation of the layers, but did not effectively wash off the coatings.

The invention has been described in detail with particular reference to preferred embodiments thereof, but it will be understood that variations and modifications can be effected within the spirit and scope of the invention.

What is claimed is:

1. A process for stripping a color filter array coating from a substrate of a solid-state color image sensing device to recover the substrate which subsequently can be used to produce another solid-state color image sensing device, said process comprising contacting said color filter array coating with a stripping solution comprising chromic acid and sulfuric acid for a time effective to remove said coating from said substrate.

2. The process of claim 1 wherein said color filter array coating comprises a photopatternable coating containing a dye.

3. The process of claim 1 wherein said stripping solution is prepard by adding a saturating amount of a chromate compound to aqueous sulfuric acid.

4. The proces of claim 3 wherein said chromate compound is potassium dichromate.

5. The process of claim 1 wherein said color filter array coating comprises a material selected from the group consisting of dichromated gelatin, a diazo resin mixed with a mordant, a poly(vinyl alcohol) in admixture with a dichromate and a polymeric mordant, an anionic mordant, a cationic mordant, and a photocrosslinkable mordant.

6. The process for stripping a color filter array coating from a substrate of a solid-state color image sensing device to recover the substrate which subsequently can be used to produce another solid-state color image sensing device, said process comprising the steps of (1) contacting said color filter array coating with a stripping solution comprising chromic acid and sulfuric acid;

(2) rinsing said substrate with water; and (3) repeating steps (1) and (2) at least once.

* * * * *